(12) United States Patent
Yin et al.

(10) Patent No.: US 9,797,975 B2
(45) Date of Patent: Oct. 24, 2017

(54) PHANTOM FOR MAGNETIC RESONANCE IMAGING SYSTEM

(71) Applicant: SIEMENS AKTIENGESELLSCHAFT, München (DE)

(72) Inventors: Hai Ping Yin, Hong Kong (CN); Wen Qiang You, Shenzhen (CN)

(73) Assignee: SIEMENS AKTIENGESELLSCHAFT (DE)

( * ) Notice: Subject to any disclaimer, the term of this patent is extended or adjusted under 35 U.S.C. 154(b) by 400 days.

(21) Appl. No.: 14/487,468

(22) Filed: Sep. 16, 2014

(65) Prior Publication Data

US 2015/0084625 A1   Mar. 26, 2015

(30) Foreign Application Priority Data

Sep. 24, 2013   (CN) ..................... 2013 2 0602079 U

(51) Int. Cl.
*G01R 33/58*   (2006.01)

(52) U.S. Cl.
CPC ................................... *G01R 33/58* (2013.01)

(58) Field of Classification Search
CPC ....................................................... G01R 33/58
See application file for complete search history.

(56) References Cited

U.S. PATENT DOCUMENTS

| | | | |
|---|---|---|---|
| 4,613,819 A * | 9/1986 | Chui | ...................... G01R 33/58 324/300 |
| 4,692,704 A | 9/1987 | Gray | |
| 4,777,442 A | 10/1988 | Rosenthal | |
| 4,818,943 A | 4/1989 | Chandra | |
| 4,888,555 A | 12/1989 | Lesan | |

(Continued)

FOREIGN PATENT DOCUMENTS

CN   201259534   6/2009

OTHER PUBLICATIONS

"MRI Phantoms—Are there Alternatives to Aga", Hellerbac et al., PLOS ONE, vol. 8, Issue 8, Aug. 2013.

(Continued)

*Primary Examiner* — G. M. Hyder
(74) *Attorney, Agent, or Firm* — Schmeiser Olsen & Watts LLP

(57) ABSTRACT

A phantom for an MRI system is provided. The phantom includes a third layer, the third layer including a first structure and a second structure, the first structure including two adjacent wedge-shaped objects in opposite directions which do not generate magnetic resonance signals, the second structure includes a first module group pair, the first module group pair including a first module group and a second module group, the first module group and the second module group each including multiple modules which are identical to each other, aligned with each other and separated from each other by the same distance, and the first module group and the second module group are perpendicular to each other. The phantom for an MRI system can satisfy measurement of multiple image quality indices such as layer thickness and resolution at the same time, which saves a large amount of repetitive work and time.

10 Claims, 5 Drawing Sheets

(56) References Cited

U.S. PATENT DOCUMENTS 5,036,280 A 7/1991 Chesavage
5,165,050 A 11/1992 Goodenough et al.

OTHER PUBLICATIONS

"Tissue mimicking materials for multi-imaging modality prostate phantom", D'Souza et al., Medical Physics, vol. 28, No. 4, Apr. 2001.
Brain Phantoms for Ultra High Field MRI, Villemaire, Department of Medical Biophysics, University of Western Ontario, Apr. 13, 2010; "Quantitative Medical Image Processing", NIST, available at https://isg.nist.gov/deepzoomweb/resources/csmet/pages/medical_imaging/medical_imaging.html;
sessionid=2931D720E99B3294538DB927C4AB43AE.
"Phantom Test Guidance"; American College of Radiology, Jun. 2005 available at http://www.acraccreditation.org/~/media/ACRAccreditation/Documents/MRI/LargePhantomGuidance.pdf?la=en.
"Phantom Test Guide for Use of the Small MRI Phantom for the MRI Accreditation Program", American College of Radiology, available at http://www.acraccreditation.org/~/media/ACRAccreditation/Documents/MRI/SmallPhantomGuidance.pdf?la=en.
"Centers of Quantitative Imaging Excellence Manual of Procedures: Part C MRI Technical Procedures", version 3.2, Mar. 2013.

\* cited by examiner

_US 9,797,975 B2_

PHANTOM FOR MAGNETIC RESONANCE IMAGING SYSTEM

CROSS-REFERENCE TO RELATED APPLICATIONS

This application claims priority to CN Application No. 201320602079.6 having a filing date of Sep. 24, 2013, the entire contents of which are hereby incorporated by reference.

FIELD OF TECHNOLOGY

The following relates to the technical field of magnetic resonance imaging (MRI), in particular to a phantom for an MRI system.

BACKGROUND

Magnetic resonance imaging (MRI) is an imaging technology involving biomagnetics and nuclear spin, which has developed rapidly together with computer technology, electronic circuit technology and superconductor technology. It uses a magnetic field and radio frequency (RF) pulses to make hydrogen nuclei (i.e. H+) which are precessing in human tissue experience nutation and generate RF signals, which are processed by computer to form an image. By placing an object in the magnetic field, using suitable electromagnetic waves to irradiate it so that it resonates, and then analysing the electromagnetic waves it releases, the positions and types of the atomic nuclei which make up the object can be discovered, and on this basis it is possible to draw a precise three-dimensional image of the interior of the object. For instance, a human brain can be scanned using MRI to obtain an animated image of contiguous slices, from the top of the head all the way to the base.

Compared to other medical imaging products such as X-ray products and CT products, MRI systems can provide high-contrast images of different soft tissues. Excellent image quality is the foundation of medical imaging products, so it is necessary to carry out image quality assessment in the system development stage as well as in the product delivery stage, in order to guarantee quality. In order to establish an image quality assessment system, many standards have been formulated, the most important of which is IEC62464-1(2007), "Magnetic resonance equipment for medical imaging—Part 1: Determination of essential image quality parameters". This standard was adopted by the Chinese national standard YY/T0482-2010 in July 2012. This national standard is a necessary condition for successful registration in China of all MRI products.

At present, in order to assess image quality, it is necessary to use a designed phantom filled with an aqueous agent or an oily agent. Phantoms are already widely used for assessing the image quality of medical imaging equipment, and are capable of meeting the requirements of many image quality indices by being designed to have different structures and/or to be filled with different solvents. The results of assessment are highly accurate, and reproducible.

A test of image quality for an MRI system includes the following six indices: signal-to-noise ratio (SNR), homogeneity, layer thickness, geometric deformity, resolution and ghost images. In the prior art, tests for layer thickness and resolution must be conducted separately using two different types of phantom; furthermore, no single multi-functional phantom for all six of the above indices currently exists. To test each image quality index, it is necessary to image different phantoms separately, but the use of different phantoms to test different image quality indices will give rise to the following technical problems:

1) In order to test different image quality indices, the operator must continually change different phantoms, which is a time-consuming and laborious process.

2) A maximum of six phantoms are needed for all six of the image quality indices, therefore human labor and material resources are needed to store and maintain each phantom.

SUMMARY

An aspect relates to a phantom for an MRI system, comprising a third layer, the third layer comprising a first structure and a second structure, the first structure comprising two wedge-shaped objects which have sides adjacent to one another, do not generate magnetic resonance signals, and have sloping surfaces in opposite directions; the second structure comprises a first module group pair, the first module group pair comprising a first module group and a second module group, the first module group and the second module group each comprising multiple modules which are identical to each other, parallel to each other and separated from each other by the same distance; and the first module group and the second module group are perpendicular to each other.

The phantom further comprises a base on which the first structure and second structure are located.

The phantom further comprises a first layer, the first layer comprising a first internal region and a first external region, the first internal region being round and filled with a solvent for generating a magnetic resonance signal, and the first external region being annular and enclosing the first internal region.

The phantom further comprises a second layer, the second layer comprising a second internal region and a second external region, the second internal region being round and filled with a solvent for generating a magnetic resonance signal, the second external region being annular and enclosing the second internal region, and the diameter of the second internal region being greater or less than the diameter of the first internal region.

The phantom further comprises a fourth layer, the fourth layer having one or more second module group pairs, each second module group pair comprising a third module group and a fourth module group, the third module group and fourth module group each comprising multiple modules which are identical to each other, parallel to each other and separated from each other by the same distance, and the third module group and the fourth module group being perpendicular to each other.

The modules in the third module group are parallel to the modules in the first module group; the modules in the fourth module group are parallel to the modules in the second module group.

The angle between a long edge of the bottom surface of the second structure and a long edge of the bottom surface of the first structure is in the range 10° to 15°.

The thickness of the modules is b, the separation of the modules is L, and b/(b+L) is in the range 0.3 to 0.39.

The distance between thickness centers of two adjacent layers is no more than 30 mm.

A side of the phantom is provided with multiple positioning marks.

BRIEF DESCRIPTION OF DRAWINGS

Some of the embodiments will be described in detail, with reference to the following figures, wherein like designations denote like members, wherein.

DETAILED DESCRIPTION

Various embodiments of the invention are explained in further detail below with reference to embodiments and the accompanying drawings, in order to clarify the technical solution and merits thereof. It should be understood that the particular embodiments described here are intended merely to explain the invention elaboratively, not to define the scope of protection thereof.

Figure 1:
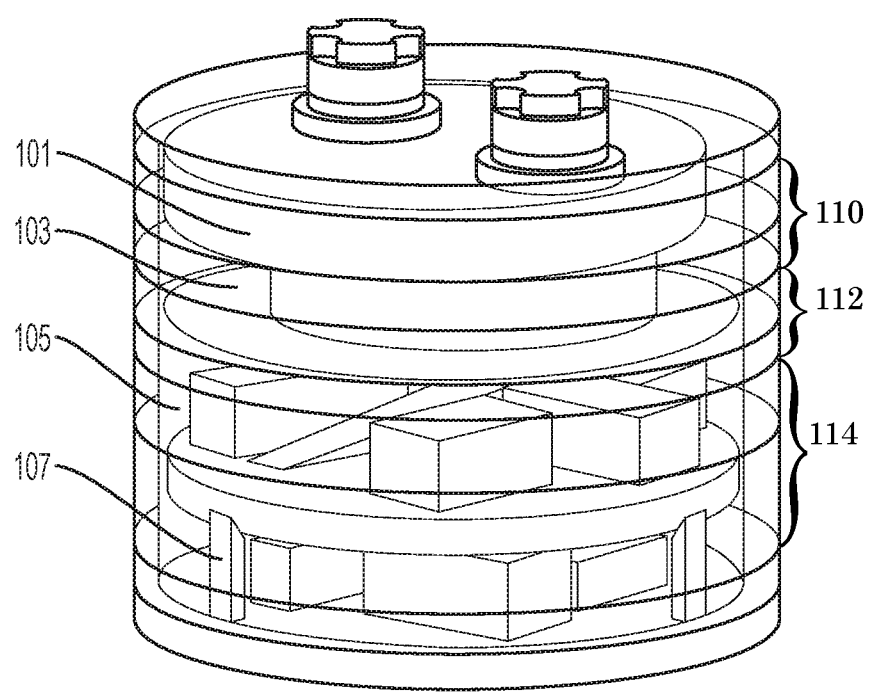
FIG. 1 is a perspective view of an embodiment of the phantom for an MRI system.

FIG. 1 is a perspective view of the phantom 100 for an MRI system according to an exemplary embodiment. As FIG. 1 shows, the phantom 100 according an exemplary embodiment has a cylindrical shape overall and comprises the following four layers from top to bottom: a first layer for testing ghosts, geometric distortion, homogeneity (for coils having smaller regions of interest) and SNR; a second layer for testing SNR, homogeneity and geometric distortion; a third layer for testing layer thickness and resolution; and a fourth layer (additional layer) for testing resolution. The order of the abovementioned layers and their positions relative to one another may be adjusted as desired; moreover, MRI system phantoms 100 according to other particular embodiments may comprise one or more of the abovementioned layers.

Figure 2:
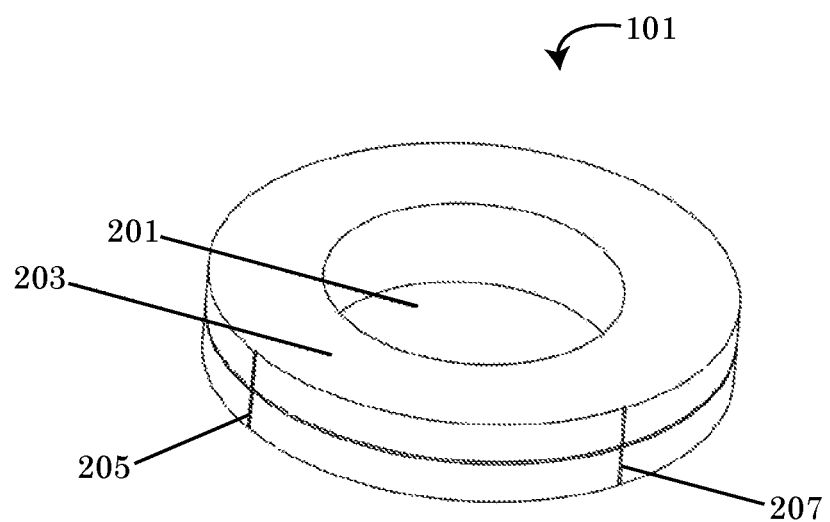
FIG. 2 is a perspective view of an embodiment of the first layer of the phantom for an MRI system.

FIG. 2 is a perspective view of the first layer 101 of the phantom 100 for an MRI system according to an exemplary embodiment. As FIG. 2 shows, the first layer 101 of the phantom 100 for an MRI system according to an exemplary embodiment is cylindrical, and has a first internal region 201 and a first external region 203, the first external region 203 being a plastic ring enclosing the first internal region 201. The first internal region 201 is filled with a solvent. The first layer 101 may also be used for measuring the SNR and homogeneity of coils having smaller regions of interest. Since the inner diameter of the first internal region 201 is known, measurement of geometric distortion may also be accomplished in the first layer 101. As FIG. 2 shows, an outer surface of the external region 203 of the first layer 101 comprises multiple positioning marks 205, 207.

Figure 3:
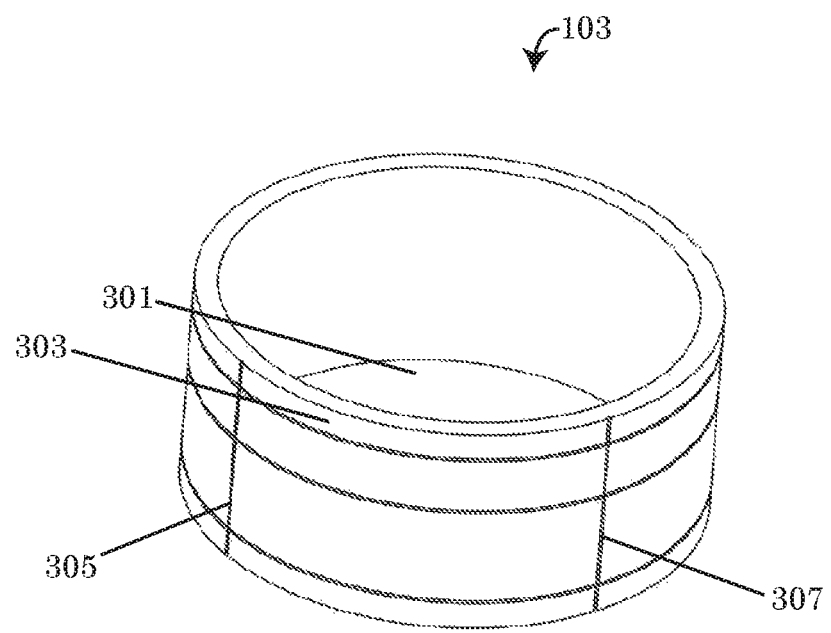
FIG. 3 is a perspective view of an embodiment of the second layer of the phantom for an MRI system.

FIG. 3 is a perspective view of the second layer 103 of the phantom 100 for an MRI system according to an exemplary embodiment. As FIG. 3 shows, the second layer 103 of the phantom 100 for an MRI system according to an exemplary embodiment is cylindrical, and has a second internal region 301 and a second external region 303, the second external region 303 being a plastic ring enclosing the second internal region 301. The second internal region 301 is filled with a solvent. The radius of the second internal region 301 is greater than the radius of the first internal region 201. The second layer 103 may also be used for measuring SNR and homogeneity. Since the inner diameter of the second internal region 301 is known, measurement of geometric distortion can be accomplished in the second layer 103. As FIG. 3 shows, an outer surface of the external region 303 of the second layer 103 comprises multiple positioning marks 305, 307.

Figure 4A:
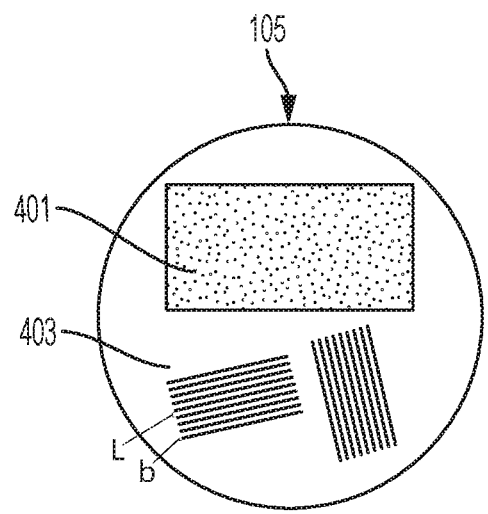
FIG. 4A is a view from above of an embodiment of the third layer of the phantom for an MRI system.

FIG. 4A is a view from above of the third layer 105 of the phantom 100 for an MRI system according to an exemplary embodiment. The third layer 105 of the phantom 100 for an MRI system according to an exemplary embodiment cylindrical; as FIG. 4A shows, the third layer 105 comprises two structures (a first structure 401 and a second structure 403) and a base 405, the base 405 being in the form of a flat disk. The two structures 401, 403 are located on the base 405, wherein the first structure 401 is used for measuring layer thickness, while the second structure 403 is used for measuring resolution. Since the first structure 401 and second structure 403 are located in the same layer 105 of the phantom 100, only a single imaging is needed to measure two image quality indices, namely layer thickness and resolution. This design feature can reduce the image acquisition time by half an hour when used for measurement in three orthogonal directions.

Figure 4B:
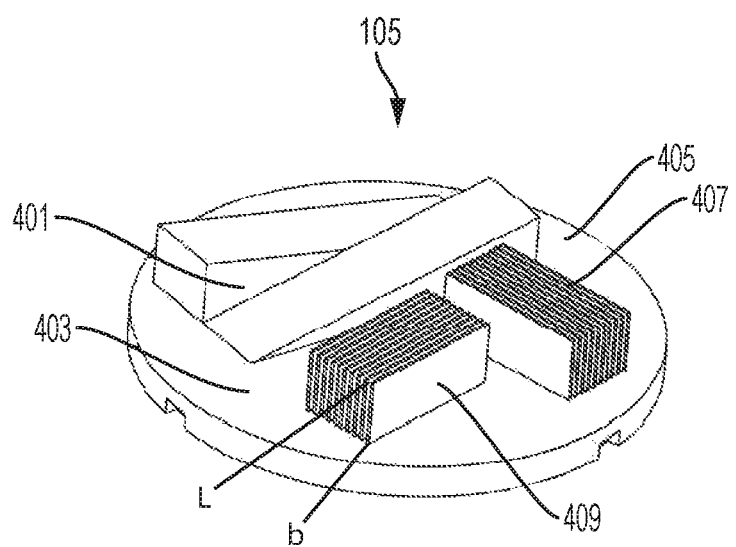
FIG. 4B is a perspective view of an embodiment of the third layer of the phantom for an MRI system.

FIG. 4B is a perspective view of the third layer 105 of the phantom 100 for an MRI system according to an exemplary embodiment. As FIG. 4B shows, the first structure 401 comprises two wedge-shaped objects for layer thickness measurement, which have sides adjacent to one another, do not generate magnetic resonance signals, and have sloping surfaces in opposite directions. An angle α is formed between the sloping surface and bottom surface (the flat disk) of each of the two wedge-shaped objects, where α=11.3°, so that tan α=⅕.

As FIG. 4B shows, the second structure 403 comprises a first module group pair, the first module group pair comprising a first module group 407 and a second module group 409.

The first module group 407 and the second module group 409 each comprise multiple rectangular modules which are identical to each other, parallel to each other and separated from each other by the same distance. The first module group 407 and the second module group 409 are perpendicular to each other, so that the bottom surface of the second structure 403 is in the shape of an L with one long edge and one short edge. The second structure 403 is used for image resolution measurement in horizontal and vertical directions simultaneously. Each module group 407, 409 comprises ten rectangular modules separated from each other by the same distance, wherein the module thickness is b, the module separation is L, and b/(b+L) is in the range 0.3 to 0.39; one feasible solution is b=1 mm, L=1.6 mm. The angle between the long edge of the bottom surface of the second structure 403 and the long edge of the bottom surface of the first structure 401 is 10° to 15°, preferably 13°. During use, the phantom 100 is positioned so that the long edge of the bottom surface of the wedge-shaped object lies along the horizontal direction of the image. This design facilitates accurate positioning of the phantom 100 for an MRI system according to an exemplary embodiment, and hence accurate measurement of resolution.

Figure 5:
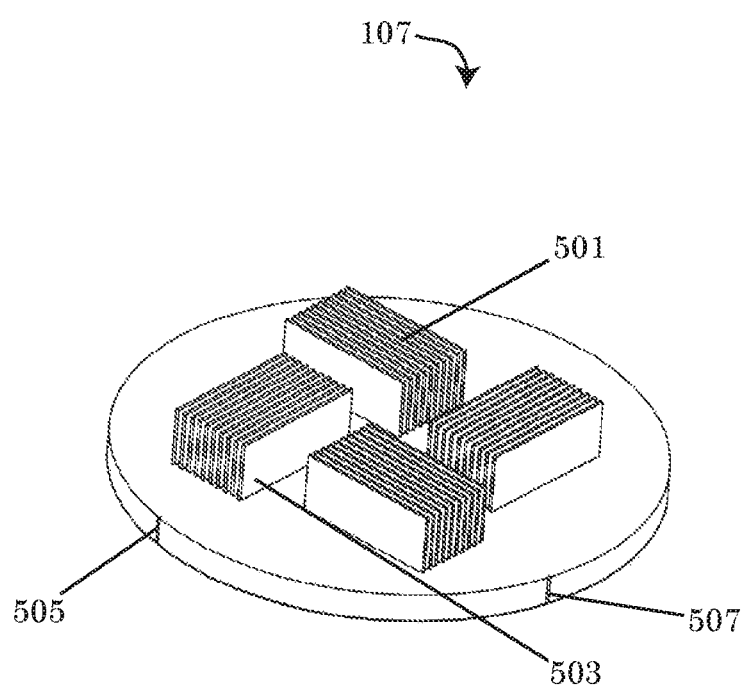
FIG. 5 is a perspective view of an embodiment of the fourth layer of the phantom for an MRI system.

FIG. 5 is a perspective view of the fourth layer 107 of the phantom 100 for an MRI system according to an exemplary embodiment. As FIG. 5 shows, the fourth layer 107 has one or more second module group pairs 501, 503, each second module group pair 501, 503 comprising a third module group 501 and a fourth module group 503. The third module group 501 and fourth module group 503 each comprise multiple modules which are identical to each other, parallel to each other and separated from each other by the same distance. The third module group 501 and the fourth module group 503 are perpendicular to each other. The reason for providing the fourth layer 107 is that a given module group can only be used to measure the resolution for one spatial frequency 1/(b+L). Multiple pairs of module groups in the fourth layer 107 (second module group pairs 501, 503) are arranged parallel to the module groups in the third layer 105 (the first module group pair 407, 409), in the thickness direction of the third layer 105 and fourth layer 107; in other words, the modules in the third module group 501 are parallel to the modules in the first module group 407, while the modules in the fourth module group 503 are parallel to the modules in the second module group 409. Different module thicknesses b and module separations L may be chosen in order to measure resolution at a greater number of different spatial frequencies.

The surface of the phantom 100 for an MRI system according to an exemplary embodiment is provided with multiple positioning marks 205, 207, 305, 307, 505, 507, located in middle positions of each layer, respectively. The positioning marks can increase the accuracy of image quality measurement. In the phantom 100 for an MRI system according to an exemplary embodiment, the distance between the thickness centers 110, 112, 114 of two adjacent layers is no more than 30 mm. To be specific, for example, the distance between the thickness center 110 of the first layer 101 and the thickness center of the second layer 103, and the distance between the thickness center 112 of the second layer 103 and the thickness center of the third layer 105, are no more than 30 mm. Based on this design feature, when the phantom 100 is used, the second layer 103 is positioned at the isocenter, and the image planes formed of the first layer 101 and third layer 105 will then be within +30 mm of the isocenter, meeting the positioning requirements stipulated by the IEC62464-1 standard, so that imaging can be performed without repositioning. This design feature enables a huge amount of time to be saved when placing and positioning a water phantom. As stated above, the above mentioned layers 101, 103, 105, 107 may be arranged at will, with no need to comply with the order adopted in exemplary embodiments. Thus, besides the phantom 100 for an MRI system in this embodiment, the distance between the thickness centers 110, 112, 114 of two adjacent layers in other phantoms comprising multiple layers is also no more than 30 mm.

The phantom 100 for an MRI system according to an exemplary embodiment cannot only meet the requirements for measuring all six image quality indices of the IEC62464-1 standard, but also simplify the work flow and save time. In the prior art, 15 to 20 minutes is generally needed for a single operation of placing and positioning a phantom. The phantom 100 for an MRI system according to an exemplary embodiment need only be positioned once to measure all six image quality indices, so about 3 hours can be saved in the course of measurement in three orthogonal image planes.

The above embodiments are merely preferred embodiments of the invention, and are not intended to define the scope of protection thereof. Any amendments, equivalent substitutions or improvements etc. made within the spirit and principles of the present invention should be included in the scope of protection thereof.

The invention claimed is:

1. A phantom for a magnetic resonance imaging system, comprising:
    a first layer, the first layer comprising a first internal region and a first external region;
    a second layer comprising a second internal region and a second external region;
    wherein the first internal region, the second internal region, or a combination thereof are filled with a solvent for generating a magnetic resonance signal; and
    a third layer, the third layer comprising a first structure and a second structure, the first structure comprising two wedge-shaped objects which have sides adjacent to one another, do not generate magnetic resonance signals, and have sloping surfaces in opposite directions;
    wherein the second structure comprises a first module group pair, the first module group pair comprising a first module group and a second module group, the first module group and the second module group each comprising multiple modules which are identical to each other, parallel to each other and separated from each other by the same distance; and the first module group and the second module group are perpendicular to each other.

2. The phantom as claimed in claim 1, further comprising a base on which the first structure and second structure are located.

3. The phantom as claimed in claim 1, wherein the first internal region is round and the first external region being annular and enclosing the first internal region.

4. The phantom as claimed in claim 3, wherein a distance between thickness centers of two adjacent layers is no more than 30 mm.

5. The phantom as claimed in claim 1, wherein the second internal region is round and filled with a solvent for generating a magnetic resonance signal, the second external region being annular and enclosing the second internal region, and the diameter of the second internal region being greater or less than the diameter of the first internal region.

6. The phantom as claimed in claim 1, further comprising a fourth layer, the fourth layer having one or more second module group pairs, each of the one or more second module group pairs comprising a third module group and a fourth module group, the third module group and fourth module group each comprising multiple modules which are identical to each other, parallel to each other and separated from each other by the same distance, and the third module group and the fourth module group being perpendicular to each other.

7. The phantom as claimed in claim 6, wherein the modules in the third module group are parallel to the modules in the first module group, and the modules in the fourth module group are parallel to the modules in the second module group.

8. The phantom as claimed in claim 1, wherein an angle between a long edge of a bottom surface of the second structure and a long edge of a bottom surface of the first structure is in a range of 10° to 15°.

9. The phantom as claimed in claim 1, wherein a thickness of the modules is b, the separation of the modules is L, and b/(b+L) is in a range 0.3 to 0.39.

10. The phantom as claimed in claim 1, wherein a side of the phantom is provided with multiple positioning marks.

* * * * *